(12) United States Patent
Johnsen

(10) Patent No.: US 9,928,315 B2
(45) Date of Patent: Mar. 27, 2018

(54) RE-ORDERED INTERPOLATION AND CONVOLUTION FOR FASTER STAGGERED-GRID PROCESSING

(71) Applicant: Chevron U.S.A. Inc., San Ramon, CA (US)

(72) Inventor: Thor Mikal Johnsen, Houston, TX (US)

(73) Assignee: CHEVRON U.S.A. INC., San Ramon, CA (US)

( * ) Notice: Subject to any disclaimer, the term of this patent is extended or adjusted under 35 U.S.C. 154(b) by 687 days.

(21) Appl. No.: 14/447,353

(22) Filed: Jul. 30, 2014

(65) Prior Publication Data

US 2016/0034612 A1 Feb. 4, 2016

(51) Int. Cl.
G06G 7/48 (2006.01)
G06F 17/50 (2006.01)
G01V 1/28 (2006.01)

(52) U.S. Cl.
CPC ............ G06F 17/5009 (2013.01); G01V 1/28 (2013.01); *G01V 2210/673* (2013.01)

(58) Field of Classification Search
CPC .................................................. G06F 17/5009
USPC .......................................................... 703/10
See application file for complete search history.

(56) References Cited

U.S. PATENT DOCUMENTS

| 4,611,312 A | 9/1986 | Ikeda |
| 6,295,505 B1 | 9/2001 | Assa et al. |
| 6,430,508 B1 | 8/2002 | Sudhakar et al. |
| 6,687,617 B2 | 2/2004 | Kelly |
| 6,778,909 B1 | 8/2004 | Popovici et al. |
| 7,035,737 B2 | 4/2006 | Ren |
| 7,039,525 B2 | 5/2006 | Mittet |
| 7,796,467 B2 | 9/2010 | Bisley et al. |
| 2004/0122596 A1 | 6/2004 | Sudhakar et al. |
| 2005/0203982 A1 | 9/2005 | Kolibal |
| 2007/0271040 A1 | 11/2007 | Ren |
| 2012/0072117 A1 | 3/2012 | Loddoch et al. |
| 2012/0095689 A1 | 4/2012 | Kostov et al. |

(Continued)

OTHER PUBLICATIONS

Frehner, Marcel, et al; "Comparison of Finite Difference and Finite Element Methods for Simulating Two-Dimensional Scattering of Elastic Waves"; Physics of the Earth and Planetary Interiors, 2008, vol. 171, pp. 112-121.

(Continued)

*Primary Examiner* — Hugh Jones

(57) ABSTRACT

Improved finite-difference staggered grid wave propagation systems and methods. One illustrative computer-based wave field simulation method includes: applying at least one signal to a grid of model cells forming a model space, each model cell having stress values associated with stress nodes and velocity values associated with velocity nodes staggered from the stress nodes; and propagating the at least one signal as a wave into the model space by alternately updating the stress values and the velocity values to obtain a time-dependent wave field associated with the at least one signal. The stress value updating includes, for each model cell: determining spatial derivatives of the velocity values for the model cell; interpolating the spatial derivatives to multiple stress nodes within the model cell; and, for each stress node within the model cell, combining the spatial derivatives associated with that stress node to update at least one stress value associated with that stress node.

20 Claims, 5 Drawing Sheets

(56) References Cited

U.S. PATENT DOCUMENTS

2013/0060476 A1 3/2013 Thomson

OTHER PUBLICATIONS

Igel, Heiner, et al; "Accuracy of Staggered 3-D Finite-Difference Grids for Anisotropic Wave Propagation"; SEG Technical Program Expanded Abstracts, Jan. 1992, pp. 1244-1246.
Igel, Heiner, et al.; "Anisotropic Wave Propagation Through Finite-Difference Grids"; Geophysics, 1995, vol. 60, No. 4, pp. 1203-1216.
Pei, Zhenglin, et al.; "Anisotropic Finite-Difference Algorithm for Modeling Elastic Wave Propagation in Fractured Coalbeds"; 2012, XP-001573406, Geophysics, vol. 77, No. 1, pp. C13-C26.
Rubio, Felix, et al.; "Finite-Difference Staggered Grids in GPUs for Anisotropic Elastic Wave Propagation Simulation"; 2014, Computers & Geosciences, vol. 70, pp. 181-189.
Sheen, Dong-Hoon, et al.; "Parallel Implementation of a Velocity-Stress Staggered-Grid Finite-Difference Method for 2-D Poroelastic Wave Propagation"; 2006, Computers & Geosciences, vol. 32, pp. 1182-1191.
International Search Report, dated Jul. 6, 2015, during the prosecution of International Application No. PCT/2015/018512, 5 pp.
Written Opinion of the International Searching Authority, dated Jul. 6, 2015, during the prosecution of International Application No. PCT/2015/018512, 7 pp.
Li, Xiaofan, et al.; "Seismic Scalar Wave Equation with Variable Coefficients Modeling by a New Convolutional Differentiator"; 2010, Computer Physics Communications, vol. 181, pp. 1850-1858.

Fig. 1
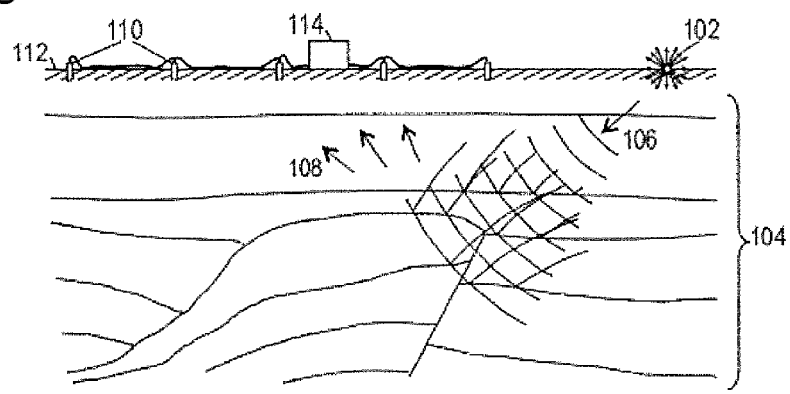
Fig. 2
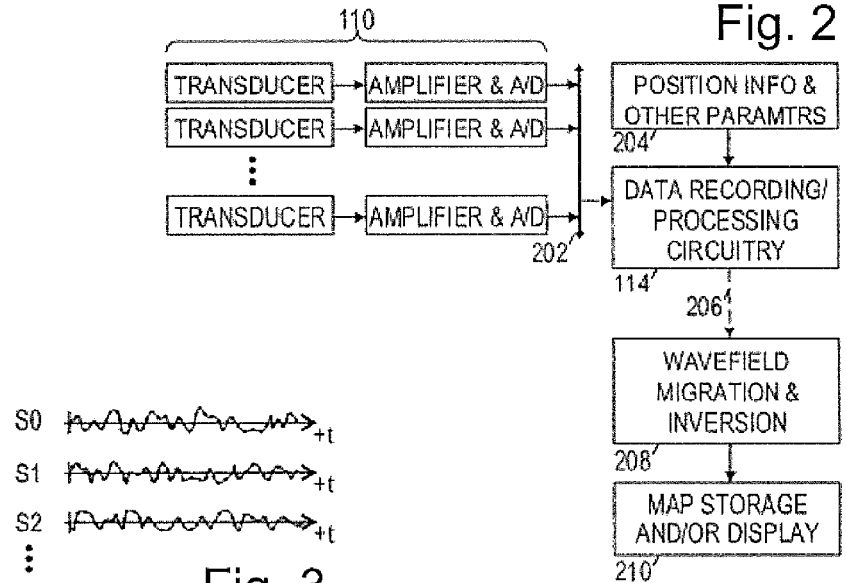
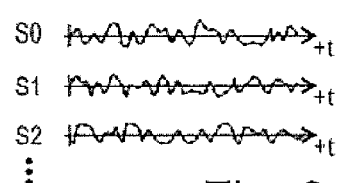
Fig. 3

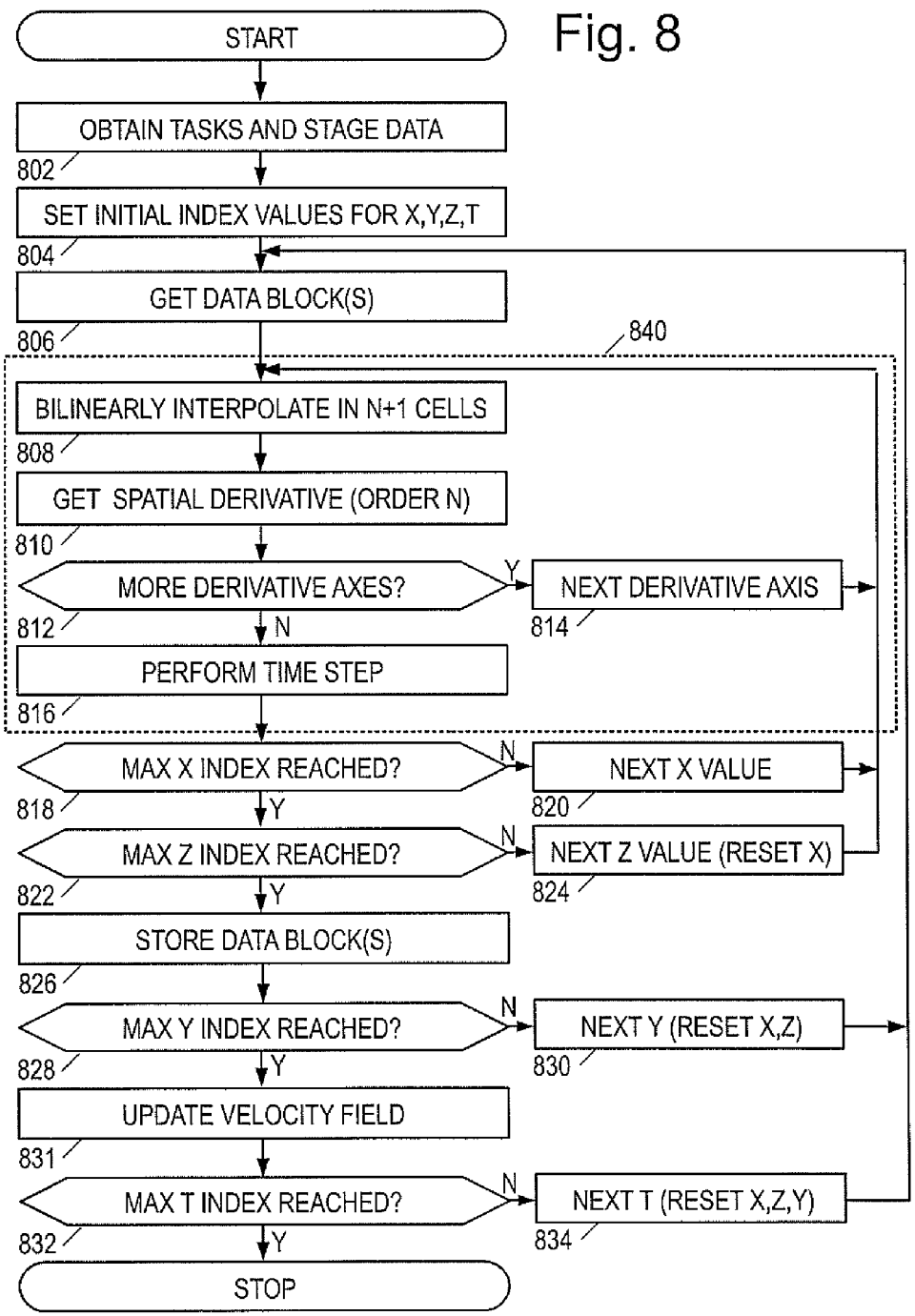

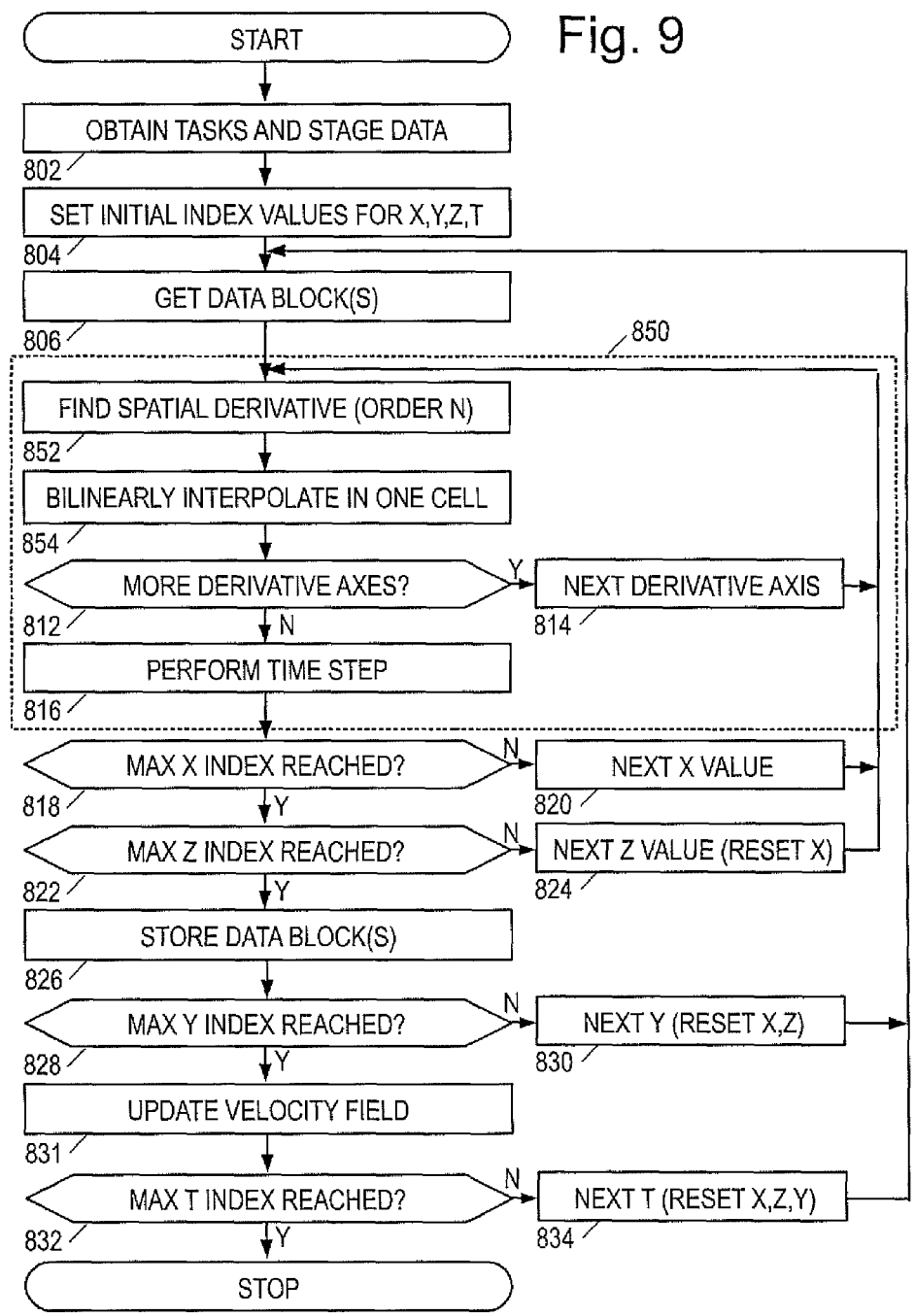

RE-ORDERED INTERPOLATION AND CONVOLUTION FOR FASTER STAGGERED-GRID PROCESSING

CROSS-REFERENCE TO RELATED APPLICATIONS

Not applicable.

STATEMENT REGARDING FEDERALLY SPONSORED RESEARCH OR DEVELOPMENT

Not applicable

BACKGROUND

Field of the Invention

This invention relates generally to the field of geophysical exploration for hydrocarbons. More specifically, the invention relates to a method of faster and more efficient grid processing in seismic modeling.

Background of the Invention

Scientists and engineers often employ geophysical surveys for exploration and engineering projects. Geophysical surveys can provide information about underground structures, including formation boundaries, rock types, and the presence or absence of fluid reservoirs. Such information greatly aids searches for water, geothermal reservoirs, and mineral deposits such as hydrocarbons and ores. Oil companies in particular often invest in extensive seismic and electromagnetic surveys to select sites for exploratory oil wells.

Geophysical surveys can be performed on land or in water. As indicated in the example survey of FIG. 1, an energy source 102 near the region of interest 104 generates waves 106 that propagate into the region of interest and reflect from internal features such as bed boundaries. Some of the reflected wave 108 energy eventually reaches an array of receivers 110 on the surface 112. A recording system 114 captures the received signals for storage and processing. The process is repeated with many different source positions and optionally with different receiver positions. Although various methods exist for converting the received wave signals into an image of the subsurface structure, the most popular such techniques employ finite difference wave field modeling, a process that propagates waves forward or backward in time using discrete time steps and fast approximations of wave function derivatives. With small enough time steps and accurate enough approximations, the finite difference wave field modeling process provides an efficient, high fidelity solution. Nevertheless, the finite difference modeling process imposes a substantial computational demand.

Many efforts have been made to satisfy the computational demands of the finite difference wave field modeling process. Many combined hardware-software solutions have been implemented in the attempt to maximize runtime efficiency. In addition to exploiting different parallelization strategies offered by different hardware systems, the software is often customized to employ different wave-propagation kernels using, e.g., different discretizations, wave equation approximations, and propagation strategies. Attempts to achieve faster processing (i.e., shorter runtimes) with acceptable fidelity while honoring the memory, bus bandwidth, and other system limitations, have led to innumerable kernel variations which are disclosed in literature. Yet the computational burdens remain undesirably high.

BRIEF SUMMARY

Accordingly, there are disclosed herein finite-difference staggered grid wave propagation systems and methods having a reduced computational burden achieved by re-ordering of operations within the propagation kernel. One illustrative computer-implemented wave field simulation method includes: applying at least one signal to a grid comprising a plurality of model cells, the grid forming a model space, each model cell having a plurality of stress values associated with a plurality of stress nodes and a plurality of velocity values associated with a plurality of velocity nodes staggered from the stress nodes; and propagating the at least one signal as a wave into the model space by alternately updating the stress values and the velocity values to obtain a time-dependent wave field associated with the at least one signal. The stress value updating includes, for each model cell: determining spatial derivatives of the velocity values for the model cell; interpolating the spatial derivatives to multiple stress nodes within the model cell; and, for each stress node within the model cell, combining the spatial derivatives associated with that stress node to update at least one stress value associated with that stress node.

The computational savings need not be restricted to wave propagation. One illustrative computer-based method provides a combined convolution-interpolation operation for applying values in a first grid to nodes in a second grid staggered from the first grid, the method including, for each cell in the second grid: obtaining a weighted sum of values in a window around a corresponding cell in the first grid using coefficients of a convolution filter; and interpolating the weighted sum to each of multiple nodes in the cell of the second grid.

A disclosed non-transitory information storage medium further provides software for a seismic imaging method that includes: applying at least one seismic source or receiver signal to a grid comprising a plurality of model cells, the grid forming a model space, each model cell having a plurality of stress values associated with a plurality of stress nodes and a plurality of values associated with a plurality of velocity nodes staggered from the stress nodes; and propagating the at least one seismic source or receiver signal as a wave into the model space by alternately updating the stress values and the velocity values to obtain a time-dependent wave field associated with the at least one seismic source or receiver signal; repeating said applying and propagating operations to obtain multiple time-dependent wave fields; analyzing a counterpart source and receiving one or more wave fields to obtain matching information; stacking the matching information to image a subsurface region represented by the model space; and displaying the image. The stress value updating includes, for each model cell: determining spatial derivatives of the velocity values for the model cell; interpolating the spatial derivatives to multiple stress nodes within the model cell; and for each stress node within the model cell, combining the spatial derivatives associated with that stress node to update at least one stress value associated with that stress node.

BRIEF DESCRIPTION OF THE DRAWINGS

In the accompanying drawing sheets:

FIG. 1 is a schematic depiction of a seismic survey.

FIG. 2 is a block diagram of a seismic survey system having a finite difference wave field simulator.

FIG. 3 is a graph of illustrative digitized receive signal traces.

FIG. 8 is a flow diagram of an illustrative migration kernel of a first type.

FIG. 9 is a flow diagram of an illustrative migration kernel of a second type.

Figure 4:
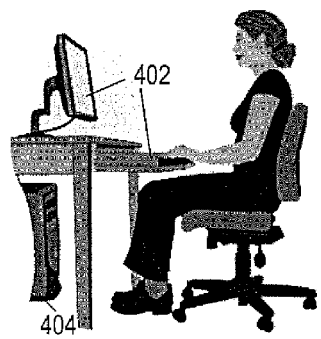
FIG. 4 is a view of a geo-modeler employing an illustrative modeling system.

It should be understood, however, that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

DETAILED DESCRIPTION

The seismic survey of FIG. 1 may be performed using the system of FIG. 2. An array of seismic receivers 110 convert seismic waves to electrical signals that are amplified and digitized. (Illustrative signal waveforms are shown in FIG. 3.) A recording system 114 collects the digitized signals via a bus 202 or other communications pathway and stores the digitized signals on a non-transitory information storage medium for later processing. Typically, each digitized signal is associated with parameters 204 such as a receiver location and a shot location and such other information as the system designer deems worthwhile. Recording system 114 may perform some initial processing to filter and/or compress the data, and in at least some cases, to perform quality control.

The recording system 114 provides the seismic survey data via the Internet or some other communications mechanism 206 to a data processing center 208 having sufficient computational resources for the imaging process. The data processing center includes one or more computers that may use finite difference wave field modeling to perform migration and thereby convert the recorded seismic signals into a three dimensional map or "image" of the subsurface structure which can be displayed on a monitor 210 and stored in persistent storage for later use.

Figure 5:
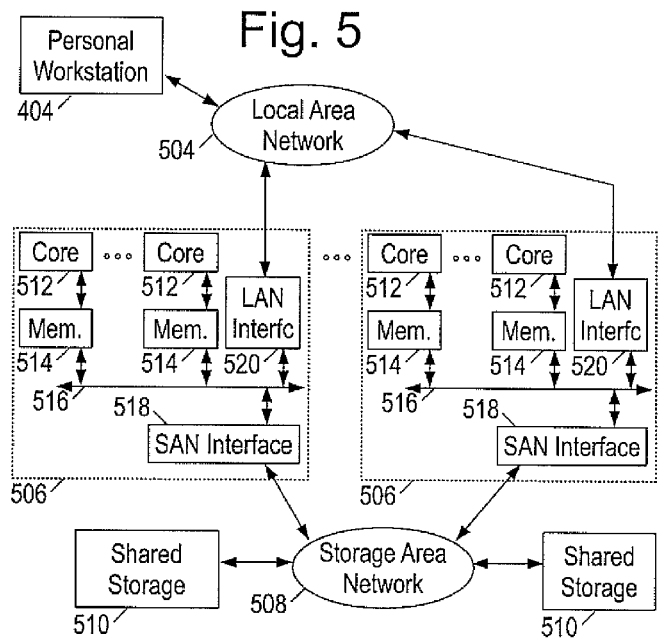
FIG. 5 is a block diagram of an illustrative hardware platform suitable for geophysical modeling.

In the data processing center 208, processing of the seismic survey data is coordinated by a geo-modeler such as that shown in FIG. 4. The geo-modeler may employ a user interface 402 of a workstation 404 to initiate processing of the seismic data and to view and analyze the resulting seismic image. The workstation 404 is part of the hardware platform of a subsurface modeling system such as that shown in FIG. 5. (Other hardware platforms are also available and suitable, including supercomputers, massively parallel processor networks, and heterogeneous architectures that include GPUs or other dedicated co-processors.)

The illustrative hardware platform couples the workstation 404 to one or more multi-processor computers 506 via a local area network (LAN) 504. The one or more multi-processor computers 506 are in turn coupled via a storage area network (SAN) 508 to one or more shared storage units 510. Using the personal workstation 404, the geo-modeler is able to load seismic survey data into the system, to configure and monitor the processing of the seismic survey data and to retrieve the results from the system, optionally in the form of volumetric images.

Personal workstation 404 may take the form of a desktop computer with a display that shows graphical representations of the input and result data, and with a keyboard that enables the user to move files and execute processing software. LAN 504 provides high-speed communication between multi-processor computers 506 and with personal workstation 404. The LAN 504 may take the form of an Ethernet network.

Multi-processor computer(s) 506 provide parallel processing capability to enable suitably prompt processing of the input data to derive the results data. Each computer 506 includes multiple processors 512, distributed memory 514, an internal bus 516, a SAN interface 518, and a LAN interface 520. Each processor 512 operates on allocated tasks to solve a portion of the overall problem and contribute to at least a portion of the overall results. Associated with each processor 512 is a distributed memory module 514 that stores application software and a working data set for the processor's use. Internal bus 516 provides inter-processor communication and communication to the SAN or LAN networks via the corresponding interfaces 518, 520. Communication between processors in different computers 506 can be provided by LAN 504.

SAN 508 provides high-speed access to shared storage devices 510. The SAN 508 may take the form of, e.g., a Fibrechannel or Infiniband network. Shared storage units 510 may be large, stand-alone information storage units that employ magnetic disk media for nonvolatile data storage. To improve data access speed and reliability, the shared storage units 510 may be configured as a redundant disk array ("RAID").

Whether the hardware platform takes the illustrated form or another suitable form, an issue common to all such platforms is the comparatively low data retrieval rate versus the rate at which the processors can perform computations. That is, most computers designed for processing large volumes of data have a memory bottleneck that limits the rate at which the processing can occur. Thus, although the computational burden associated with many parallelizable processes can be reduced by increasing the available memory, such solutions may fail to complete the processing any faster. It is often a better approach to reduce the volume of memory accesses required, even if such a strategy increases the computational burden carried by the processors.

Figure 6A:
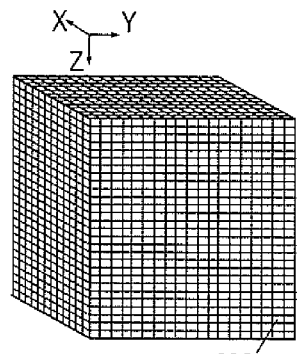
FIG. 6A is a data space representing a subsurface region of interest.

To enable the hardware platform to simulate the wave field and construct the image, the software models the region of interest as a two-dimensional or three-dimensional space divided into a grid of cells 602. FIG. 6A shows an example of a 3D space. Each cell has a representative set of values that commonly are associated with a single point within the cell. However, as disclosed in literature (see, e.g., R. W. Graves, "Simulating Seismic Wave Propagation in 3D Elastic Media Using Staggered-Grid Finite Differences", Bull. Seismological Soc. Am., v86(4) pp 1091-1106, August 1996), the use of a staggered grid yields certain efficiency advantages, at least in isotropic and orthotropic media. Before delving into the details of the staggered grid, an overview of the imaging process is helpful.

Figure 7:
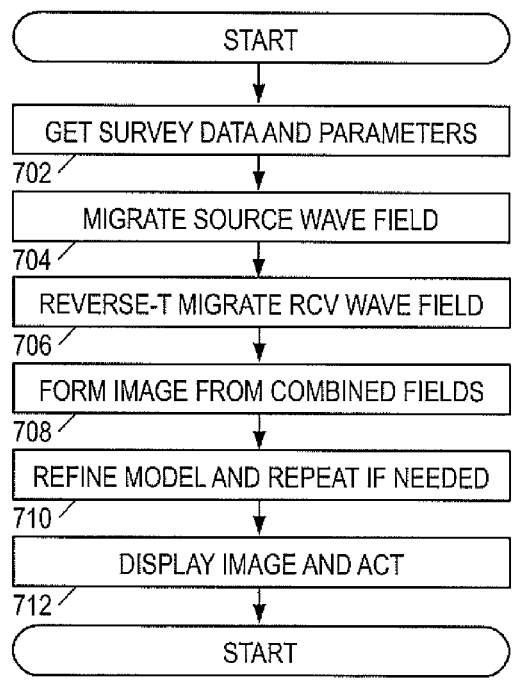
FIG. 7 is a flow diagram of an illustrative subsurface imaging method.

FIG. 7 is a flowchart of an illustrative seismic imaging method that may be performed by the computers in the data processing center. In block 702, the computers obtain the survey data, including the digitized signals and associated source and receiver position information. An initial model of the subsurface may also be obtained in this block, e.g., to specify an estimated density and elasticity as a function of position. Often a uniform density model is employed as the starting point and gradually refined during the imaging process.

In block 704, the computers simulate the evolution of the wave field (the spatial distribution of two interrelated wave parameters such as force, pressure, or stress; and displacement, velocity, or strain) generated by the source by migrating the source signal (or a suitable substitute) into the model space from the source position. That is, the source generates stress and particle velocity fields that propagate outward from the source position in accordance with the wave equation. A finite difference model simulates this propagation to determine the source wave field, i.e., the stress and particle velocity at each point in the model space, as a function of time. The propagation kernel is described further below.

In block 706, a similar operation is applied to the receive signals. Recognizing that the recorded signals represent waves that have reached the receiver locations, the corresponding particle velocities or stresses are propagated backward in time into the model space in accordance with the wave equation. The same finite difference propagation kernel as before can be used, albeit with a reversed time index, to determine the receive wave field as a function of time. (With the time reversal, receive waveforms get treated like source waveforms.)

Because reflectors in the earth converted the source wave field into the receive wave field during the survey process, these two wave fields will match at the reflection points. Accordingly, the source and receive wave fields are analyzed as a function of time and position in block 708 to identify those regions that match and hence indicate a reflection point. This process is repeated for each seismic shot and the matching information is added up ("stacked") to image the whole region of interest.

In block 710, the image is analyzed to identify inaccuracies in the estimated formation parameters (density and/or elasticity). Since such inaccuracies produce certain patterns in the image data, they enable the initial estimates to be refined. Blocks 704-710 can be iteratively repeated to gradually refine and improve the model parameters (and the resulting images). Once the model parameters converge, the computers can display the image in block 712. Actions can then be taken based on the displayed image, including steering decisions, landing decisions, and completion decisions.

A particular point of note is that the migration process may need to be repeated many times before convergence is reached, and each iteration of the migration process requires the solution of the propagation equation at each point in the model space for each time step for each shot. Hence the finite difference propagation kernel may be repeated hundreds of billions of times. Though the process includes a significant degree of parallelism which can support implementation on parallel processors, the computational burden remains high. Even small gains in the kernel's computation efficiency can yield substantial savings in execution time. Benefits of such efficiency gains in the migration process are not limited to seismic imaging. For example, migration can also be employed to simulate wave fields for a wide range of physics (acoustic waves, electromagnetic waves, fluid dynamics) and application contexts.

Figure 6B:
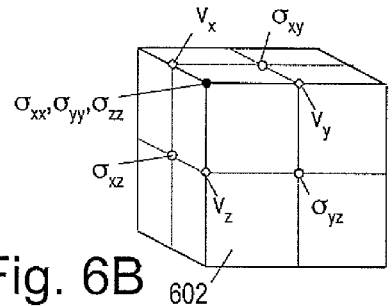
FIG. 6B is a cell of the data space having staggered grid values.

As mentioned previously, significant efficiency gains are achieved through the use of a staggered grid. An illustrative staggered-grid is illustrated in FIG. 6B, where a single cell 602 from the 3D space of FIG. 6A has normal (compressional) stress values $\sigma_{xx}$, $\sigma_{yy}$, $\sigma_{zz}$, associated with the corner nodes, shear stress values $\sigma_{xy}$, $\sigma_{xz}$, $\sigma_{yz}$, associated with respective face nodes, and velocity values $v_x$, $v_y$, $v_z$, associated with the edge nodes. The edge nodes are offset ("staggered") from the corner nodes by a half-cell spacing along one axis, and the face nodes are offset from the corner nodes by half-cell spacings along two axes. In isotropic or even orthotropic media, the finite difference operators that interrelate velocity and stress values are naturally centered on the node values they are used to modify, so no additional interpolation is needed.

Figure 6C:
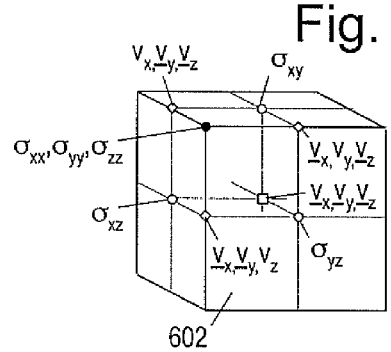
FIG. 6C is a cell of the data space including interpolated velocity values.

However, as explained in J. W. Rector, G. M. Hoversten, K. T. Nihei, "Seismic Modeling Engines Consortium", Lawrence Berkley National Laboratory, Dec. 3, 2003, additional interdependencies exist in fully generalized anisotropic media. As a consequence, the propagation kernel must be modified to do one of two things. Either the kernel can employ a full stencil (such as that used in a rotated staggered grid model), which requires four times as much memory, or the kernel can employ interpolation to provide the centering as needed. Specifically, as shown by the underlined values in FIG. 6C, the velocity values may be interpolated to the other edge nodes and to the body center node of the cell 602 to support updating of the stress values. Though such interpolation imposes an additional computational burden, it is preferable to the full stencil approach because it avoids exacerbating the memory bandwidth bottleneck and it avoids certain mesh drift instabilities.

Using tensor notation, the momentum conservation and constitutive equations for the particle velocities $v_i$ and stresses $\sigma_{ij}$ are:

$$\rho \frac{\partial v_i}{\partial t} = \frac{\partial \sigma_{ij}}{\partial x_j} + f_i \text{ and} \tag{1a}$$

$$\frac{\partial \sigma_{ij}}{\partial t} = \frac{c_{ijkl}}{2}\left(\frac{\partial v_k}{\partial x_l} + \frac{\partial v_l}{\partial x_k}\right), \tag{1b}$$

where $\rho$ is density, i, j, k, l are indices ranging over the spatial axes X, Y, Z, $x_i$ is distance along the given axis, $f_i$ is force applied along the given axis (e.g., as part of a source signal), and $c_{ijkl}$ is an elastic constant relating stress to strain. Pursuant to convention, implicit summation occurs over those indices that appear only on the right side of the equation, i.e., the right side of equation (1a) has an implicit summation over j ranging from 1 to 3 (axes X to Z), and the right side of equation (1b) has an implicit summation over k and an implicit summation over l, each ranging from 1 to 3.

It is equation (1b) that, when reduced to finite difference form, necessitates interpolation to center the differentiated fields on the stress value nodes in a staggered grid. Taking as an example the finite difference form of the equation for $\sigma_{xy}$, we have:

$$\sigma'_{xy}=\sigma_{xy}+c_{xyxx}D_x(v_x)+c_{xyyy}D_y(v_y)+c_{xyzz}D_z(v_z)+c_{xyxy}(D_x(v_y)+D_y(v_x))+c_{xyxz}(D_x(v_z)+D_z(v_x))+c_{xyyz}(D_y(v_z)+D_z(v_y)), \tag{1c}$$

where $D_i(\ )$ is the finite difference approximation of a derivative along the given axis. For the finite differences to be suitably centered on the face node for $\sigma_{xy}$, each of the velocity field components must be interpolated.

While interpolation can be a computationally inexpensive operation, each of the three velocity field components are being interpolated to complete the information at four different nodes, requiring nine interpolations within the cell. Each finite difference operator, however, operates on values from multiple cells. The number of cells (and hence the number of interpolations needed) varies with the order of the chosen finite difference operator. A finite difference operator of order N operates on values from N+1 cells. Thus, the nine finite differences for updating each of the four stress nodes of a cell require 9 interpolations to be performed in 3N+1 cells for a total of 27N+9 interpolations. For an order 3 finite difference, there are 90 interpolations needed to update one cell. Higher orders may be used for increased fidelity.

While opportunities exist for re-use of interpolated values to varying degrees, additional memory is required to store those values until they can be re-used. (At the extreme, the interpolations may be performed across the whole volume prior to This trade-off has not generally been considered acceptable. Thus there continues to be 90 interpolations performed to update each cell.

With this in mind, FIGS. 8 and 9 are flow diagrams illustrating different approaches to the propagation kernel which may be used to implement migration blocks 704, 706 (FIG. 7). The migration blocks 704, 706, parallelize the migration operation by distributing pieces of the problem (e.g., different portions of the model space) to different processors. Beginning in block 802, each processor receives its task(s), which may represent a portion of the model space, and stage the data in a local memory for expedited paging to and from the processor cache. Four indices may be used to track progress through the propagation process, the indices representing the three spatial dimensions and a time dimension. These indices are initialized in block 804.

The first data blocks are paged into cache in block 806. This example assumes that each block of data represents an x-z slice of the data volume corresponding to a given y-index value. The set of blocks 808-824 are performed as the propagation kernel iterates through a given x-z slice to update the stress values. Blocks 806 and 826-830 cause the propagation kernel to iterate through each of the slices in the data volume to complete the stress value update for a given time step. Blocks 831-834 cause the propagation kernel to iterate through subsequent time steps.

The set of cells 840 represent the operations performed for a given cell to update the stress values associated with that cell. In block 808, the processor performs bi-linear interpolation of the velocity field components to the staggered velocity nodes (see FIG. 6C) in each of N+1 cells along the current spatial derivative axis. In block 810, the finite difference along that axis is determined for each of the velocity field components at each of the stress value nodes in the current cell. In block 612, the processor checks if more spatial derivative axes exists, and if so, the next axis is chosen in block 813 and the processor returns to block 808. The axes all intercept in the current cell, so the interpolation of values for the current cell need not be repeated—only the values for the additional N cells along the selected axis need to be interpolated.

Once the full set of spatial derivatives at each stress node in the current cell has been determined, in block 816 the processor combines them with the respective elastic constants to update the stress values for the current cell. See equations (1b), (1c).

In block 818, the processor determines whether the x-index has reached the end of its range, and if not the value is incremented in block 820 and control returns to block 808. Otherwise, in block 822 the processor determines whether the z-index has reached the end of its range, and if not, the value is incremented in block 824, the x-index is reset, and control returns to block 808. Otherwise, the current x-z slice has been completed. In block 826, the updated stress values are stored. In block 828, the processor determines whether the y-index has reached the end of its range, and if not, the value is incremented in block 830, the x and z indices are reset, and control returns to block 806 to load the next data block. Otherwise, the stress values have been updated for the full data volume, and in block 831 the processor iterates through the data volume to update the velocity field in accordance with equation (1a). Once that has been completed, a full time step for the data volume has been completed. In block 832, the processor determines whether the time index has reached the end of its range, and if not, the value is incremented in block 834, the x, y, z indices are reset, and control returns to block 806.

In contrast to the propagation kernel of FIG. 8, the improved propagation kernel of FIG. 9 re-orders the interpolation and derivative operations. Thus, within the set of operations performed for each cell (box 850), the propagation kernel begins by finding the velocity components' spatial derivative (finite difference) along a given axis in block 852. For the x-axis, block 852 yields the derivatives $D_x(v_x)$, $D_x(v_y)$, $D_x(v_z)$. Due to the absence of interpolation at this step, the centering of these derivatives will vary. Derivatives $D_x(v_x)$, $D_y(v_y)$, $D_z(v_z)$, will center on the corner node, while the three face nodes will each have two associated derivatives. For example, the derivatives $D_x(v_y)$ and $D_y(v_x)$ will center on the face node associated with $\sigma_{xy}$. Due to the arrangement of the staggered nodes, no interpolation is required for this step. Then, in block 854, the processor performs bilinear interpolation within the current cell only to determine the derivative values at all of the stress nodes. As 4 stress nodes exist and each derivative calculated in block 852 is already centered on one of them, each derivative needs to be interpolated to three other nodes. After all spatial axes have been accounted for, the processor need only perform a total of 9 bilinear interpolations, irrespective of the finite difference order N. Thus, this re-ordering results in a savings of 27N interpolations.

We note that the finite difference calculations can be considered as a particular type of filter or other convolution operation. The benefits which have now been highlighted above are similarly achievable for other filtering or convolution operations being performed on interpolated values. That is, a significant computational savings is achieved by interchanging the order of the interpolation and convolution operations.

Numerous other variations and modifications will become apparent to those skilled in the art once the above disclosure is fully appreciated. For example, the details of the hardware and software implementations are subject to a wide range of variation, alternative embodiments, and different forms of optimization or approximation. Moreover, though the foregoing disclosure was provided in the context of a seismic imaging system, wave propagation may be simulated in other contexts including acoustic fields, electromagnetic fields, and fluid flow mechanics. It is intended that the following claims be interpreted to embrace all such variations and modifications.

What is claimed is:
1. A method of steering a tool, the method comprising:
applying at least one signal to a grid comprising a plurality of model cells, the grid forming a model space, each model cell having a plurality of stress values associated with a plurality of stress nodes and a plurality of velocity values associated with a plurality of velocity nodes staggered from the stress nodes, wherein the at least one signal represents a seismic shot or seismic traces received by an array of seismic sensors;

propagating the at least one signal as a wave into the model space by alternately updating the stress values and the velocity values to obtain a time-dependent wave field associated with the signal, wherein said updating stress values includes, for each model cell;

determining spatial derivatives of the velocity values for the model cell;

interpolating the spatial derivatives to multiple stress nodes within the model cell; and for each stress node within the model cell, combining the spatial derivatives associated with that stress node to update at least one stress value associated with that stress node; and repeating said applying and propagating operations to obtain a plurality of time-dependent wave fields;

analyzing a counterpart source and receive one or more wave fields to obtain matching information;

stacking the matching information to generate an image of a subsurface region represented by the model space; and steering a tool to drill a wellbore using the generated image.

2. The method of claim 1, wherein said combining the spatial derivatives comprises determining a weighted sum of the spatial derivatives using one or more elastic constants as coefficients.

3. The method of claim 1, further comprising storing the time-dependent wave field on a non-transitory information storage medium.

4. The method of claim 1, wherein the velocity values for each model cell include one or more velocity components in each of three spatial directions.

5. The method of claim 4, wherein the spatial derivatives for each model cell include one or more spatial derivatives, in each of the three spatial directions, of each velocity component for that cell.

6. The method of claim 5, wherein the spatial derivatives are each determined using a finite difference operator of order N, where N is greater than or equal to 3.

7. The method of claim 6, wherein said finite difference operator comprises a convolution filter.

8. The method of claim 5, wherein the stress values include compressional stress values in each of three spatial directions and three shear stress values, the shear stress values associated with respective shear nodes that are offset from a compressional stress node, and wherein each of the spatial derivatives are determined or interpolated to the compressional stress node and each of the shear stress nodes.

9. The method of claim 8, wherein said interpolating comprises a bilinear interpolation.

10. The method of claim 1, wherein the determined spatial derivatives from the grid are tied to a second grid staggered from the grid.

11. The method of claim 1, wherein said interpolating comprises a linear interpolation.

12. The method of claim 1, wherein said interpolating is part of a finite difference wave propagation kernel.

13. A system, comprising:
a processor;
a memory operatively connected to the processor, the memory storing instructions that, when executed by the processor, cause the system to:
apply at least one seismic source or receiver signal to a grid comprising a plurality of model cells, the grid forming a model space, each model cell having a plurality of stress values associated with a plurality of stress nodes and a plurality of values associated with a plurality of velocity nodes staggered from the stress nodes; and
propagate the at least one seismic source or receiver signal as a wave into the model space by alternately updating the stress values and the velocity values to obtain a time-dependent wave field associated with the at least one seismic source or receiver signal, wherein said updating stress values includes, for each model cell;
determine spatial derivatives of the velocity values for the model cell;
interpolate the spatial derivatives to multiple stress nodes within the model cell; and
for each stress node within the model cell, combine the spatial derivatives associated with that stress node to update at least one stress value associated with that stress node; and
repeat said applying and propagating operations to obtain multiple time-dependent wave fields;
analyze a counterpart source and receiving one or more wave fields to obtain matching information; and
stack the matching information to generate an image of a subsurface region represented by the model space; and
a tool, including steering the tool to drill a wellbore using the generated image.

14. The system of claim 13, wherein said combining the spatial derivatives comprises determining a weighted sum of the spatial derivatives using one or more elastic constants as coefficients.

15. The system of claim 13, wherein the velocity values for each model cell include one or more velocity components in each of three spatial directions.

16. The system of claim 15, wherein the spatial derivatives for each model cell include on or more spatial derivatives, in each of the three spatial directions, of each velocity component for that cell.

17. The system of claim 16, wherein the spatial derivatives are each determined using a finite difference operator of order N, where N is greater than or equal to 3.

18. The system of claim 16, wherein the stress values include compressional stress values in each of three spatial directions and three shear stress values, the shear stress values associated with respective shear nodes that are offset from a compressional stress node, and wherein each of the spatial derivatives are determined or interpolated to the compressional stress node and each of the shear stress nodes.

19. The system of claim 18, wherein said interpolating comprises a bilinear interpolation.

20. The system of claim 13, wherein the time-dependent wave field is stored on a non-transitory information storage medium.

* * * * *